United States Patent

Linliu

[11] Patent Number: 5,866,478
[45] Date of Patent: Feb. 2, 1999

[54] METALLIZATION PROCESS USING ARTIFICIAL GRAVITY

[75] Inventor: Kung Linliu, Taipei, Taiwan

[73] Assignee: Vanguard International Semiconductor, Hsin-Chu, Taiwan

[21] Appl. No.: 888,640

[22] Filed: Jul. 7, 1997

[51] Int. Cl.⁶ .................................................. H01L 21/44
[52] U.S. Cl. ...................... 438/660; 438/637; 438/631; 438/632; 438/672; 438/669
[58] Field of Search ...................... 438/660, 637, 438/631, 632, 672, 669

[56] References Cited

U.S. PATENT DOCUMENTS 3,716,461  2/1973  Ahmad ........................................ 204/16
5,002,115  3/1991  Noordegraaf et al. .................... 164/97
5,712,207  1/1998  Lee et al. ................................. 438/660

*Primary Examiner*—John F. Niebling
*Assistant Examiner*—Lynne A. Gurley
*Attorney, Agent, or Firm*—George O. Saile; Stephen B. Ackerman

[57] ABSTRACT

Voids in via holes in integrated circuits have been effectively removed by heating the vias to a relatively low temperature and then subjecting the entire structure (including the vias) to artificial gravitational forces. Said forces may be steadily applied, as in centrifuging, or they may be applied intermittently by using a jerking motion which is repeated several times. A number of different ways for implementing such jerking motion are described. These include magnetic repulsion, vertical pulling by a motor, and providing a pressure differential between the top and bottom sides of the integrated circuit holder.

17 Claims, 4 Drawing Sheets

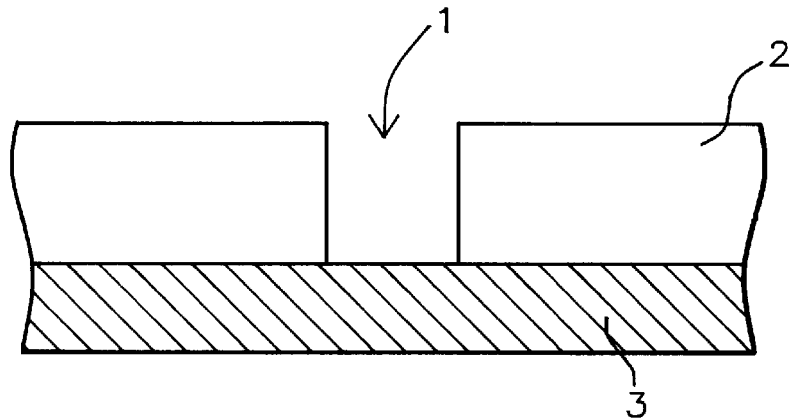
FIG. 1a
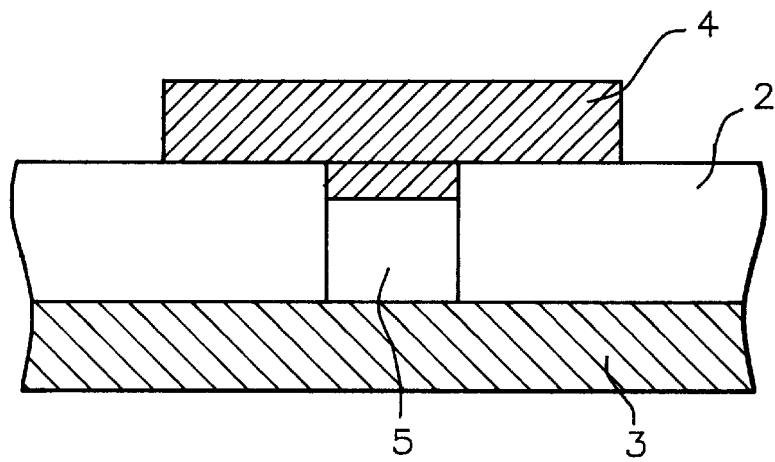
FIG. 1b
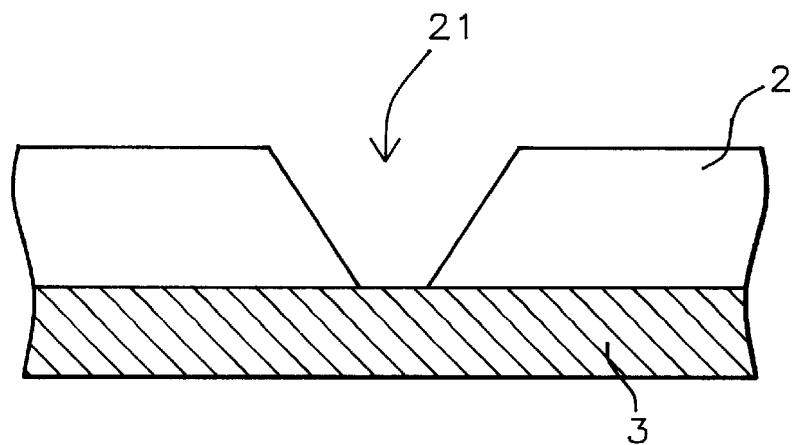
FIG. 2 – Prior Art

METALLIZATION PROCESS USING ARTIFICIAL GRAVITY

BACKGROUND OF THE INVENTION (1) Field of the Invention

The invention relates to the general field of semiconductor integrated circuits, more particularly to methods for removing voids in conductive vias in integrated circuits.

(2) Description of the Prior Art

As integrated circuits grow ever denser, the devices and the wires that connect them need to shrink in size. This required size reduction also applies to the conductive vias that are used to make electrical connections between wires at different levels. When the diameters of the via holes get to be less than about 0.5 microns, it becomes increasingly more difficult to fill them completely and reliably so that metal is guaranteed to extend across the entire gap between the two levels that are being connected.

This problem of filling very small diameter via holes is illustrated in FIGS. 1a and 1b. In FIG. 1a, via hole 1, having vertical sidewalls, has been etched through insulating layer 2. The latter was previously deposited onto layer 3 of conductive wiring. FIG. 1b shows how a problem of completely filling such a via hole can arise. Instead of extending all the way to layer 3 by filling via hole 1, layer 4 of next level wiring has penetrated only part way which has resulted in the formation of void 5.

During the deposition of layer 4, atoms of 4 would reach the bottom of via hole 1 only if they happened to be travelling almost exactly parallel to the vertical sidewalls of 1. All other atoms would condense on these sidewalls some distance from the bottom of the hole which would quickly fill near the top, effectively preventing even the few correctly oriented atoms from reaching the bottom.

A number of solutions to this problem have been proposed in the prior art. For example, as shown in FIG. 2, a tapered via hole 21 may be used. This leads to good hole filling but limits the density of vias that can then be achieved. Subjecting the structure to high temperatures and/or pressures, after top metal deposition, has also been proposed. These methods, while potentially effective, are not totally satisfactory. High temperatures add to the thermal budget (total energy needed to manufacture the structure) and also introduce the possibility of causing unwanted changes in other parts of the structure. High pressures require expensive specialized equipment and also introduce a safety risk into the operation.

Since one of the embodiments of the present invention involves the use of centrifuging, we note that centrifuging has been described in the prior art as a method for improving the concentration of filler particles in composite materials. For example, Noordegraaf et al. (U.S. Pat. No. 5,002,115 March 1991) describe a method for evenly dispersing filler particles or fibers, such as silicon carbide, in a metal matrix, such as zinc. A mesh that holds the fiber particles is placed above an empty mould and a cover plate with a hole is placed over the mesh. Molten metal is poured through the hole and, under the influence of the centrifuging action, is forced through the mesh into the mould, taking filler particles with it.

Ahmad (U.S. Pat. No. 3,716,461 February 1973) is also an improved method for forming a composite material. The matrix metal is formed by means of electrodeposition, the filler particles being suspended in the electrolyte. The rate at which filler particles settle is increased by centrifuging so their concentration in the electro-formed material is similarly increased.

We are unaware of any published applications of artificial gravity that has been generated by methods other than centrifuging. In a pending application by the same inventor, (patent application Ser. No. 08/703,919 filed Aug. 22, 1996) artificial gravity, generated in several different ways, was used to assist in the planarizing of the surface of an integrated circuit. The present invention uses similar technology for generating the artificial gravity but, beyond that, is quite unrelated to Ser. No. 08/703,919.

SUMMARY OF THE INVENTION

It has been an object of the present invention to provide a method for removing voids from conductive vias in integrated circuits, particularly when the via hole is less than about 0.5 microns in diameter.

A further object of the invention has been that said method operate at atmospheric pressure and consume less energy than other methods currently in use.

A still further object has been that the removal of voids from the vias take only a few minutes to happen.

These objects have been achieved by heating the vias to a relatively low temperature and then subjecting the entire structure (including the vias) to artificial gravitational forces. Said forces may be steadily applied, as in centrifuging, or they may be applied intermittently by using a jerking motion which is repeated several times. A number of different ways for implementing such jerking motion are described.

BRIEF DESCRIPTION OF THE DRAWINGS

FIGS. 1a and 1b illustrate the nature of the problem solved by the present invention.

FIG. 2 shows one solution that is known in the prior art.

DESCRIPTION OF THE PREFERRED EMBODIMENTS

Figure 3:
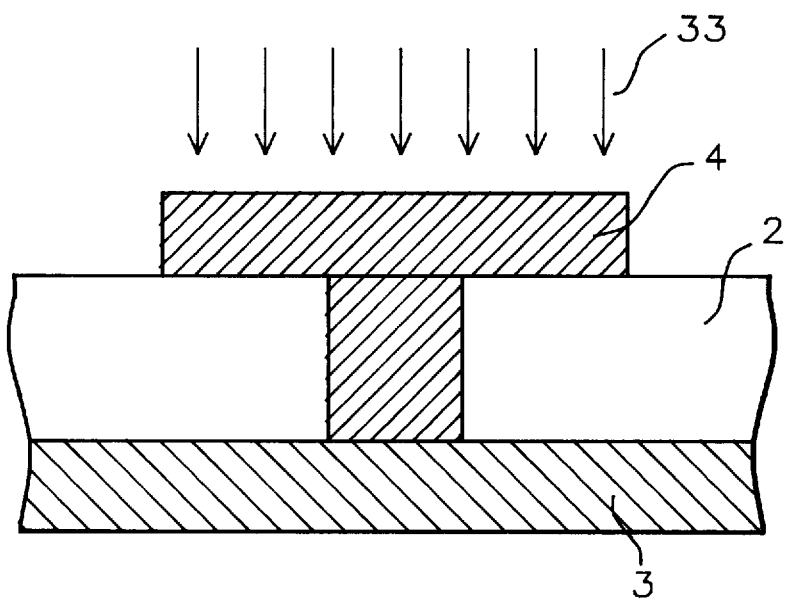
FIG. 3 shows the result of applying the teachings of the present invention.

As discussed in the background section, voids may be present in vias, particularly when the via holes have very small diameters (less than about 0.5 microns). This was illustrated in FIG. 1b. Since the thickness of the dielectric layer in which the vias are formed is generally between about 0.8 and 1.5 microns, this implies an aspect ratio for these difficult-to-fill via holes that is greater than about 2. Also, as previously noted, the application of uniform pressure to the surface of the top layer (most commonly aluminum, aluminum-copper, or aluminum-silicon-copper) will cause the void to be eliminated. This is illustrated in FIG. 3 which shows a force (symbolized by arrows 33) pressing down on the upper surface with the void seen in FIG. 1*b* now eliminated. Note that the upper surface has remained planar and no dimple has appeared above the via hole.

The present invention teaches that voids in vias can be removed by using artificial gravity. Thus, after the vias have been formed, the structures are heated to a temperature between about 350° and 450° C. and then subjected to an artificial gravitational force. This force is applied in a direction normal to the structure's surface and may be accomplished by using one of several possible methods.

The most widely used method for generating artificial gravity is through the centrifugal force provided by a centrifuge. A number of other methods of generating artificial gravitational forces are also described below. These other methods all depend on jerking the structure in a direction normal to its surface. 'Jerking' is defined as a special case of an impulsive force. The latter, as used in mechanics, is a force having a high and varying value that is applied for a very short time. Jerking is achieved by suddenly arresting a uniform linear motion. Another example of an impulsive force is 'striking' where uniform linear motion is rapidly imparted to a body that is at rest. Jerking generates very high gravitational fields but only for very short periods of time. Thus, it will in general be necessary to repeat the jerking motion a number of times. However, because the distances involved are so small, and the momentary G forces so large, the number of times that jerking has to be repeated is relatively small. Thus, between about 50 and 10,000 times is generally sufficient to remove most voids that may occur inside vias.

We now discuss the various methods that we have used for producing artificial gravity, in greater detail:

1st Embodiment

Figure 4:
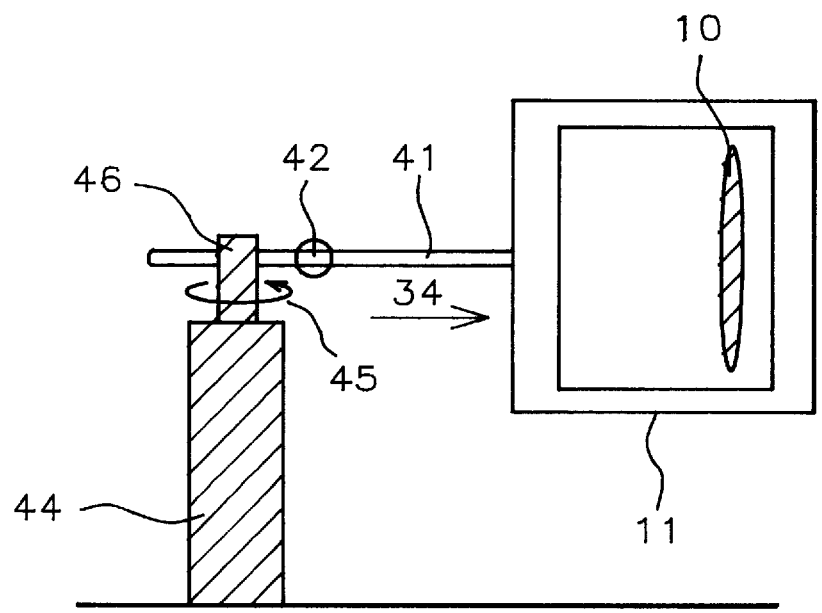
FIG. 4 illustrates an embodiment of the invention wherein a centrifuge is used to generate artificial gravity.

Referring to FIG. 4, the structure, such as wafer 10, is placed at the bottom of holding, or isolation, chamber 11. Initially, centrifuge arm 41 hangs vertically downward from pivot point 42. As centrifuge shaft 46 begins to rotate, through the action of centrifuge motor 44, arm 41, and attached chamber 11, begin to move outwards until 41 is fully horizontal as seen in the figure. In general, the centrifuge's angular velocity 45 will be in the range of from about 500 to about 8,000 revolutions per minute. For an effective centrifuge arm length of about 15 cm. this corresponds to a gravitational force 34 between about 50 and 10,000 times the earth's gravity at the wafer surface.

By using such artificial gravitational force (applied for a period of time between about 0.2 and 4 minutes) it becomes possible to remove any voids that were present in the vias.

2nd Embodiment

Figure 5:
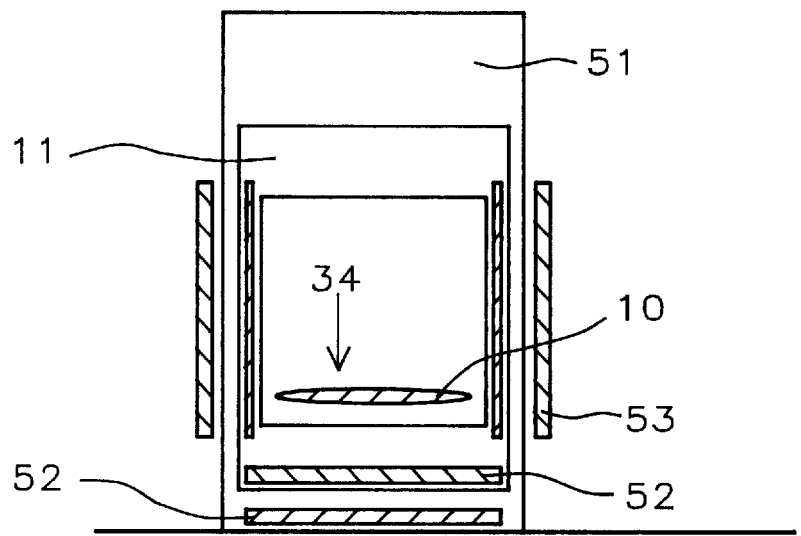
FIG. 5 illustrates an embodiment of the invention wherein mutually repellant magnetic coils are used to generate artificial gravity.

Referring now to FIG. 5, wafer 10, including vias with possible voids, sits near the bottom of isolation chamber 11 which in turn sits inside sleeve 51. Chamber 11 is free to move up and down inside 51. A pair of magnetic coils 52 (or, alternatively, permanent magnets) are arranged so that one coil lies on the bottom of isolation chamber 11 and is rigidly attached thereto. The other coil lies on the bottom of sleeve 51. Initially, chamber 11 is at rest in its lowest position inside sleeve 51. The coils are then activated by passing current through them so that they are polarized in opposite directions. Thus, like magnetic poles are suddenly facing each other so they immediately and rapidly move apart. Since only 11 is free to move, it acquires the full rapid upward motion in a very short time. That is, it is rapidly accelerated in a direction 34 normal to the wafer surface, providing an artificial gravitational force between several tens and several thousand times earth gravity for a few tenths of a second. The motion introduced by the sudden activation of coils 52 is self-limiting since the repulsive force diminishes very rapidly as they pull apart and the weight of 11 soon causes the direction of motion to be reversed.

Coils 53 are arranged to be concentric, with the inner coil rigidly attached to chamber 11 while the outer coil is rigidly attached to sleeve 51. Initially, chamber 11 is at its lowest position in sleeve 51 and the two coils are lined up. The coils are then activated by passing current through them so that they are similarly polarized at their ends. This causes the rapid ejection of the inner coil which moves in its only available direction, namely upward. Once the inner coil has moved a short distance upward, relative to the outer coil, the repulsive force driving it becomes insignificant but now the attractive force between the bottom of the inner coil and the top of the outer coil becomes significant and the relative motion continues, stopping once the two coils are in equilibrium.

The present invention could work with either coils 52 or 53 operating alone or, as shown in the figure, operating together. For any of these possible configurations the activating current is turned off after less than a few tens of seconds, chamber 11 is allowed to slide to its lowest position in sleeve 31, and then the entire process is repeated—as often as desired (typically between about 1 and 10 times).

3rd Embodiment

Figure 6:
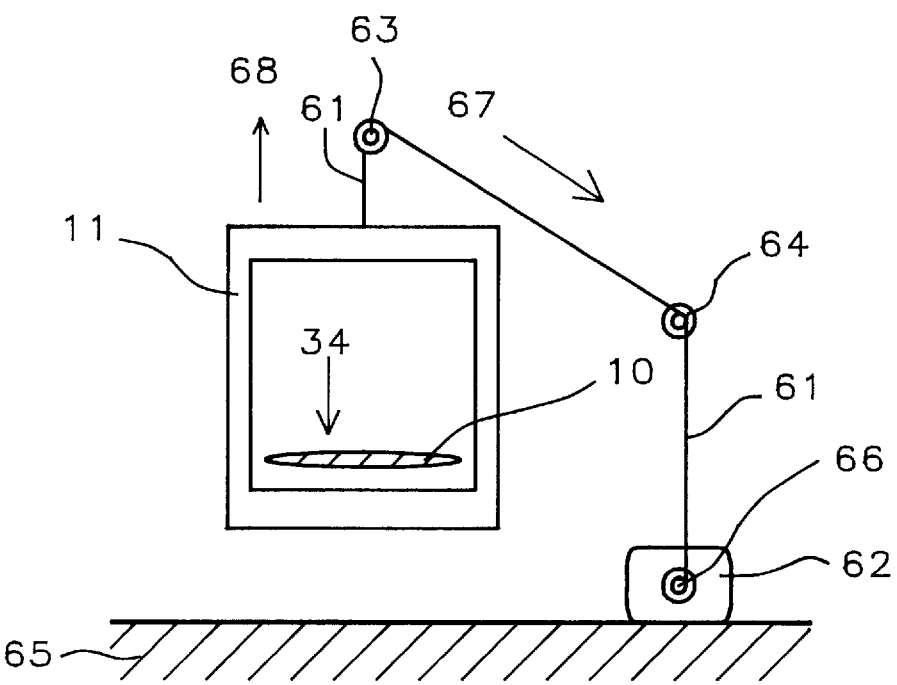
FIG. 6 illustrates an embodiment of the invention wherein rapid upward motion caused by an electric motor is used to generate artificial gravity.

Referring now to FIG. 6, wafer 10, including vias with possible voids, sits near the bottom of isolation chamber 11. A connection has been made to the top of 11 by a flexible connector 61 which runs over direction changing pulleys 63 and 64, to electric motor 62. Initially, chamber 11 is at rest on surface 65 and connector 61 is not connected to motor 62. Then, using a suitable clutch mechanism (not shown), 61 is attached to 62 at shaft 66 and is immediately pulled in directions 67 and 68, the latter being vertical upward motion for chamber 11. Thus, wafer 10 will be subjected to rapid vertical motion, implying rapid acceleration in direction 34. The attachment of 61 to 66 is allowed to be in effect for less than about several tens of seconds, following which 61 is released, chamber 11 slides down to rest once more on surface 65, and then the entire process may be repeated as often as desired.

Since the attachment of 61 to motor 62 is for such a very short time, it is desireable to maximise the distance travelled by chamber 11 during that time. To that end, in a further refinement of this embodiment, a suitable set of gears and/or pulleys is located between motor 62 and the point where 61 attaches to chamber 11 so that the motion of 61 is magnified relative to that of shaft 66. That is, the mechanical advantage of these gears and/or pulleys is less than one.

4th Embodiment

Figure 7:
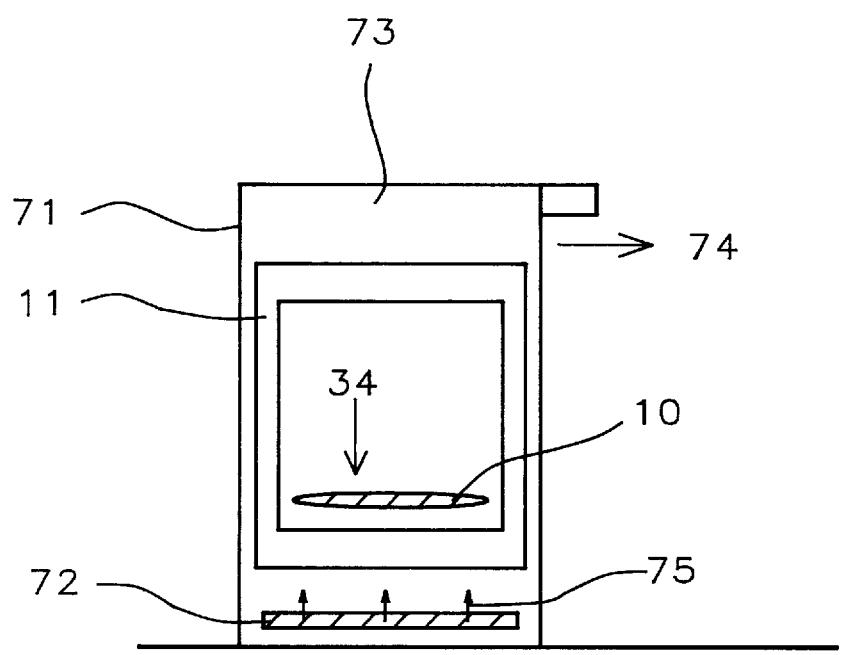
FIG. 7 illustrates an embodiment of the invention wherein a pressure differential between the top and under sides of the wafer holder is used to generate artificial gravity.

Referring now to FIG. 7, wafer 10, including vias with possible voids, sits near the bottom of isolation chamber 11. In a somewhat similar arrangement to that shown in FIG. 5, chamber 11 is inside sleeve 71. In this embodiment, however, the ends of the sleeve are closed off and, while 11 is able to move freely up and down inside 71, its fit inside 71 is such that gas cannot leak past it between the upper half 73 and the lower half 72 of closed off sleeve 71.

Initially, chamber 11 rests near the bottom of 71 and the upper and lower chambers (73 and 72 resp.) are at the same gas pressure (about 760 torr). Then, simultaneously, lower chamber 72 is connected to the atmosphere through vents 75 and upper chamber 73 is connected to a source of vacuum through exhaust vent 74. This causes chamber 11 to move rapidly in an upward direction, thereby accelerating wafer 10 in direction 34 normal to its surface.

To prevent damage to chamber 11 and particularly to wafer 10, a shock absorbing mechanism (not shown) is provided at the top of chamber 11 and/or the bottom of sleeve 71's upper surface. The state of vacuum for upper chamber 73 and atmospheric pressure for lower chamber 72 is maintained for a time period in the range of less than several tens of seconds and several hundred seconds, following which air is slowly admitted into 73 and 72 is gently evacuated so that chamber 11 slides down to the bottom of sleeve 71 and the entire process can then be repeated as many more times as desired.

While the invention has been particularly shown and described with reference to the preferred embodiments thereof, it will be understood by those skilled in the art that various changes in form and details may be made without departing from the spirit and scope of the invention.

What is claimed is:

1. A method for removing voids in a conductive via, comprising:

providing a structure that includes a dielectric layer, having a thickness, on a first conductive layer;

etching a via hole, having a diameter, through the dielectric layer;

depositing a second conductive layer, having a surface, onto the dielectric layer and into the via hole;

heating the structure to a temperature; and applying a constant artificial gravitational force in a direction normal to said surface for a period of time.

2. The method of claim 1 wherein said second conductive layer is taken from the group consisting of aluminum, aluminum-copper, and aluminum-silicon-copper.

3. The method of claim 1 wherein the thickness of the dielectric layer is between about 0.8 and 1.5 microns.

4. The method of claim 1 wherein said via hole diameter is less than about 0.5 microns.

5. The method of claim 1 wherein the temperature to which the structure is heated is between about 350° and 450° C.

6. The method of claim 1 wherein said period of time is between about 0.2 and 4 minutes.

7. The method of claim 1 wherein said artificial gravitational force is centrifugal force.

8. The method of claim 7 wherein the centrifugal force is achieved by revolving the wafer at an angular velocity between about 500 and 8,000 revolutions per minute thereby generating an artificial gravitational force between about 50 and 10,000 times normal gravity.

9. A method for removing voids in a conductive via, comprising:

providing a structure that includes a dielectric layer, having a thickness, on a first conductive layer;

etching a via hole, having a diameter, through the dielectric layer;

depositing a second conductive layer, having a surface, onto the dielectric layer and into the via hole;

heating the structure to a temperature; and jerking the structure in a direction normal to the surface, a number of times, thereby generating artificial gravitational forces between about 50 and 10,000 times normal gravity.

10. The method of claim 9 wherein jerking the structure in a direction normal to the surface, further comprises:

mounting a first magnetic coil in fixed spatial relationship relative to the wafer;

mounting a second magnetic coil in a fixed position; and energizing both coils in a manner that causes them to repel one another.

11. The method of claim 9 wherein jerking the structure in a direction normal to the structure surface, further comprises:

placing the structure in an isolation chamber; and simultaneously increasing gas pressure below the isolation chamber and decreasing gas pressure above the isolation chamber, thereby causing said isolation chamber, including the structure, to move in an upward direction.

12. The method of claim 9 wherein jerking the structure in a direction normal to the structure surface, further comprises vertically pulling on a connector to said structure.

13. The method of claim 9 wherein said second conductive layer is taken from the group consisting of aluminum, aluminum-copper, and aluminum-silicon-copper.

14. The method of claim 9 wherein the thickness of the dielectric layer is between about 0.8 and 1.5 microns.

15. The method of claim 9 wherein said via hole diameter is less than about 0.5 microns.

16. The method of claim 9 wherein the temperature to which the structure is heated is between about 350° and 450° C.

17. The method of claim 9 wherein the number of times the structure is jerked is between 1 and 10.

* * * * *